(12) United States Patent
Gudgel et al.

(10) Patent No.: US 7,591,961 B2
(45) Date of Patent: Sep. 22, 2009

(54) TRANSLUCENT PIEZOELECTRIC GLASS CERAMIC

(75) Inventors: Katherine Ann Gudgel, Evanston, IL (US); Peter Blaum, Bodenheim (DE); Mark J. Davis, Clarks Summit, PA (US); Paula Vullo, Pittston, PA (US)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 11/699,442

(22) Filed: Jan. 29, 2007

(65) Prior Publication Data

US 2007/0203011 A1 Aug. 30, 2007

Related U.S. Application Data

(60) Provisional application No. 60/764,036, filed on Feb. 1, 2006.

(51) Int. Cl.
*H01L 41/187* (2006.01)
*C03C 10/02* (2006.01)
*C03C 10/04* (2006.01)
*C03C 10/14* (2006.01)

(52) U.S. Cl. .................. 252/62.9 R; 501/4; 501/5; 501/10

(58) Field of Classification Search .......... 501/4–10; 252/62.9 R, 62.9 PZ
See application file for complete search history.

(56) References Cited

U.S. PATENT DOCUMENTS

| 3,639,771 | A * | 2/1972 | Borrelli et al. | ............. 250/225 |
| 3,785,834 | A * | 1/1974 | Rapp | ............................. 501/2 |
| 7,053,015 | B2 * | 5/2006 | Ochi | .......................... 501/10 |
| 2005/0107237 | A1 * | 5/2005 | Ochi | .......................... 501/10 |
| 2007/0199348 | A1 * | 8/2007 | Gudgel et al. | ................. 65/33.1 |
| 2007/0208509 | A1 * | 9/2007 | Davis et al. | .................... 702/1 |

OTHER PUBLICATIONS

H. Jain; Transparent Ferroelectric Glass-Ceramics; Feb. 2004; pp. 111-127.
Arvind Halliyal et al.; Glass-ceramics for piezoelectric and pyroelectric devices; 1989; pp. 273-315.

* cited by examiner

*Primary Examiner*—Karl E Group
(74) *Attorney, Agent, or Firm*—Harness, Dickey & Pierce, P.L.C.

(57) ABSTRACT

A translucent piezoelectric glass ceramic is disclosed. The glass ceramic is prepared from a precursor glass by a ceraming process, using a temperature gradient to effect the precipitation of non-ferroelectric piezo-active crystallites from the precursor glass with a preferred direction of orientation and having an average crystal size of less than 1 micrometer. Alternatively, a translucent piezoelectric glass ceramic comprising ferroelectric crystallites may be prepared by poling. In this case the crystal size is controlled to be smaller than 90 nanometers but preferably larger than 10 nanometers.

17 Claims, 2 Drawing Sheets

TRANSLUCENT PIEZOELECTRIC GLASS CERAMIC

RELATED APPLICATIONS

This application is based on U.S. provisional application Ser. No. 60/764,036 filed on Feb. 1, 2006 the contents of which are fully incorporated herein by reference.

BACKGROUND OF THE INVENTION

The invention relates to a piezoelectric glass ceramic which is translucent at least in the visible light range or in the infrared range.

The invention relates to a piezoelectric glass ceramic which is translucent at least in the visible light range or in the infrared range.

Piezoelectric materials are intensively used worldwide, due to their unique material's performance. Piezoelectric glass ceramic materials provide an interesting and promising alternative to conventional piezoelectric materials such as PZT ceramics. Since PZT apart from zirconium and titanium contains lead, piezoelectric glass ceramics have a potential to replace PZT as an alternative lead-free material.

The term piezoelectricity refers to the ability of a material to produce measurable electrical charge as a result of an applied stress (or the converse—an applied electrical charge (field) results in a change of shape of the material). For such functionality to exist, however, one main constraint must be met: the material to give rise to a piezoelectric response must lack a center of symmetry (COS). This immediately rules out all glasses and many different types of crystals, but not all. In particular, crystals that belong to those point groups that lack a COS ("acentric") are piezo-active. Moreover, other classes of materials are also piezo-active, including various organic materials. This reliance on a lack of symmetry, thus, requires that a glass contains acentric crystals in order for the composite material, a glass ceramic, to be potentially piezo-active. However, this is only a necessary condition for functionality, not a sufficient one. For the material to be functional, the composite material itself must lack a COS. For example, a single crystal of $NaNbO_3$ is acentric and thus, by definition, lacks a COS. However, a glass ceramic (or ceramic for that matter) containing randomly-oriented crystals of $NaNbO_3$ has a COS. To break this symmetry requires either (1) crystal alignment, typically during the ceramization process of a glass ceramic; or (2) internal domain alignment via the application of an electric field (so-called "poling") which is only available for ferroelectric materials. In so doing, the material would now be acentric and should thus exhibit measurable piezoelectricity. "Ferroelectric" materials are those that have internal domains whose orientation can be switched (and aligned) during the application of an electric field. PZT is one of the common conventional material of the ferroelectric type. However, ferroelectricity is not a requirement for piezo-activity, and thus there are many types of crystals (e.g. quartz, lithium disilicate, etc.) that are non-ferroelectric but are piezo-active. For these types of materials, crystal alignment is necessary to achieve a functional material.

Halliyal et al., "Glass ceramics for piezoelectric and pyroelectric devices", in *Glass and Glass-ceramics*, edited by M. H. Lewis, pp. 273-315, Chapman and Hall, London, 1989, investigated a variety of glass ceramics showing piezoelectric or pyroelectric behavior. In particular, they investigated a glass-ceramic material prepared from lithium borosilicate precursor glasses ($Li_2O$—$B_2O_3$—$SiO_2$). Halliyal et al. used a crystallization in a temperature gradient which was generated by positioning polished glass samples on a microscope hot stage. Thereby piezoelectric samples could be prepared from non-ferroelectric piezo-active materials by effecting a preferred direction of orientation of the precipitated crystallites. Halliyal et al. reported a piezoelectric charge constant $d_{33}$ (parallel to the crystallization direction) in the range of 5 $pCN^{-1}$. The diameter of the crystallites generated by the hot stage method was generally in the range of 1 to 3 micrometers. The samples produced by the hot stage method all became opaque and milky-white after crystallization (Halliyal 1984, The Study of the piezoelectric and pyroelectric properties of polar glass ceramics, Ph.D. thesis, The Pennsylvania State University, 1984).

However, for various applications of piezoelectric glass ceramics it would be highly desirable to provide materials which are translucent, at least to a certain extent within the visible (VIS) range or within the infrared (IR) range.

By H. Jain, "Translucent ferroelectric glass ceramics", Ferroelectrics vol. 306, 2004, 111-127, translucent ferroelectric glass ceramics were investigated. Jain reported that barium titanate and various niobate glass ceramics are translucent only, if the crystallite size is smaller than 0.2 micrometer. However, such samples did not show typical ferroelectric hysteresis or dielectric constant peak at the ferroelectric transition temperature. According to Jain in general, devitrification of glass increases optical loss from enhanced scattering. Jain reported that pyroelectric measurements on a devitrified CdO doped $NaNbO_3$—$SiO_2$ translucent composition where believed to indicate that crystalline aggregates of less than 100 nm were ferroelectric.

However, this ferroelectricity was not demonstrated for a glass ceramic in general, but only for some devitrified samples. Also translucency of the respective samples was not confirmed.

SUMMARY OF THE INVENTION

In view of this it is a first object of the invention to disclose a translucent piezoelectric glass ceramic.

It is a second object of the invention to disclose a translucent piezoelectric glass ceramic that can be prepared in a reproducible way as a glass ceramic.

It is a third object of the invention to disclose a piezoelectric glass ceramic that that is clearly piezoelectric and also translucent, at least to some extent in the VIS region or IR region.

It is a forth object of the invention to disclose a method for preparing such a piezoelectric glass ceramic.

These and other objects are achieved by a translucent piezoelectric glass ceramic prepared from a precursor glass by a ceraming process, the glass ceramic comprising non-ferroelectric piezo-active crystallites precipitated from the precursor glass with a preferred direction of orientation and having an average crystal size of less than 1 micrometer.

According to the invention is was found that surprisingly a good translucency can be reached in combination with a piezoelectric behavior by controlling the average crystal size to be clearly smaller than 1 micrometer, in particular to be smaller than 500 nm, or even smaller than 200 nm, or 120 nm, or even smaller than 100 nm.

The precursor glass from which the glass ceramic is prepared comprises preferably $Li_2O$, $B_2O_3$ and $SiO_2$.

Using lithium borosilicate glasses as a precursor glass stable glass ceramics showing piezoelectric behavior that are translucent in the visible range at the same time, can be prepared.

According to another development of the invention the precursor glass comprises 55 to 80 wt.-% of $SiO_2$, 1 to 40 wt.-% of $B_2O_3$ and 1 to 30 wt.-% of $Li_2O$, preferably 65 to 75 wt.-% of $SiO_2$, 5 to 15 wt.-% of $B_2O_3$ and 15 to 25 wt.-% of $Li_2O$.

More preferably, the precursor glass comprises 70 to 73 wt.-% of $SiO_2$, 9 to 11 wt.-% of $B_2O_3$, and 18 to 22 wt.-% of $Li_2O$.

The crystallites that precipitate from this glass ceramic are primarily $Li_2Si_2O_5$, $Li_2SiO_3$, $Li_xB_yO_z$ and quartz.

The average crystal sizes of the crystallites of the type $Li_2Si_2O_5$ is preferably controlled to be smaller than 200 nm, preferably smaller than 150 nm, more preferably smaller than 100 nm.

According to a further development of the invention the glass ceramic comprises crystallites of the type $Li_2SiO_3$ the average crystal size of which is controlled to be smaller than 200 nm, preferably smaller than 150 nm, preferably smaller than 100 nm, more preferably smaller than 50 nm.

The lithium borosilicate glass ceramic may also contain quartz crystallites preferably having an average crystal size of less than 200 nm, preferably of less than 150 nm, more preferably of less than 120 nm.

Keeping the crystal sizes in these sub-nanometer ranges good translucency in the VIS range and the IR range can be reached while simultaneously a good piezoelectric characteristic can be obtained when the preferred direction of orientation of the piezo-active crystallites is ensured.

One preferred method of obtaining such a preferred direction of orientation of the piezo-active crystallites is to employ a temperature gradient across the precursor glass during the precipitation of the non-ferroelectric piezo-active crystallites.

This can be done in a simple way within a furnace, when the precursor glass is placed in contact with a brick material having a larger (or smaller) thermal capacity than formed by the precursor glass.

Using this "brick method" a controlled temperature gradient can be obtained during the ceraming process which also leads to carefully controlled crystal sizes in the sub-nanometer range which may offer translucency. In addition, the precursor glass that is placed in the furnace in contact with the brick material may be cooled or heated during the ceraming step, this allowing to effect even more pronounced temperature gradients and thus an even more effective orientation of the piezo-active crystallites.

The object of the invention is further solved by a translucent piezoelectric glass ceramic prepared from a precursor glass by a ceraming process comprising ferroelectric crystallites precipitated from the precursor glass and subsequently poled by an electric field, the crystallites having an average crystal size of less than 90 nm.

The object of the invention is fully solved in this way. While keeping the average size of the crystals smaller than 90 nm, translucency can be reached, at least in the IR range. When using a precursor glass comprising $SiO_2$, $Na_2O$ and $Nb_2O_5$ and possibly $K_2O$ in addition to $Na_2O$ or an exchange of $Na_2O$, stable glass ceramics showing piezoelectric behavior after poling can be obtained which are also translucent at least in the IR range.

Preferably a precursor glass comprising 10 to 35 wt.-% of $SiO_2$, 0 to 20 wt.-% of $Na_2O$, 0 to 30 wt.-% of $K_2O$ and 50 to 80 wt.-% of $Nb_2O_5$ is used.

More preferably, the precursor glass comprises 15 to 25 wt.-% of $SiO_2$, 5 to 20 wt.-% of $Na_2O$, 0 to 15 wt.-% of $K_2O$ and 55 to 75 wt.-% of $Nb_2O$.

In these glass ceramics the crystal size of the $NaNbO_3$ crystallized crystallites is preferably controlled to be in a range of 10 to 60 nm, preferably between 15 and 50 nm for the average crystal size. It was found that the crystal size in particular of the ferroelectric crystallites which have a considerably larger refractive index than the precursor glass must be carefully controlled to effect translucency. The crystal size must be small enough to avoid too much scattering and must also be large enough to yield a piezoelectric behavior.

If the precursor glass also contains potassium oxide, in the glass ceramic potassium/silica-niobate crystallites precipitate, the crystal size of which is controlled to have an average crystal size between 5 and 50 nm, preferably, between 10 and 30 nm. The potassium may also be present in solid solution with sodium niobate crystallites.

Using such precursor glasses and controlling the crystal size of the precipitated crystallites to be in this range allows to prepare stable glass ceramics that show relatively low dielectric constants allowing for high $g_{33}$ values and for moderate $d_{33}$ values while being at least partially translucent in the VIS range and/or the IR range.

Translucency can be at least 20% or even 30% or more in the VIS range (380 nm-780 nm) and/or in the IR range (>780 nm).

BRIEF DESCRIPTION OF THE DRAWINGS

In the following the invention is more fully described with reference to the drawings and to some non-limiting examples which are merely of exemplary nature. In the drawings show.

DETAILED DESCRIPTION OF THE PREFERRED EMBODIMENTS

Figure 1:
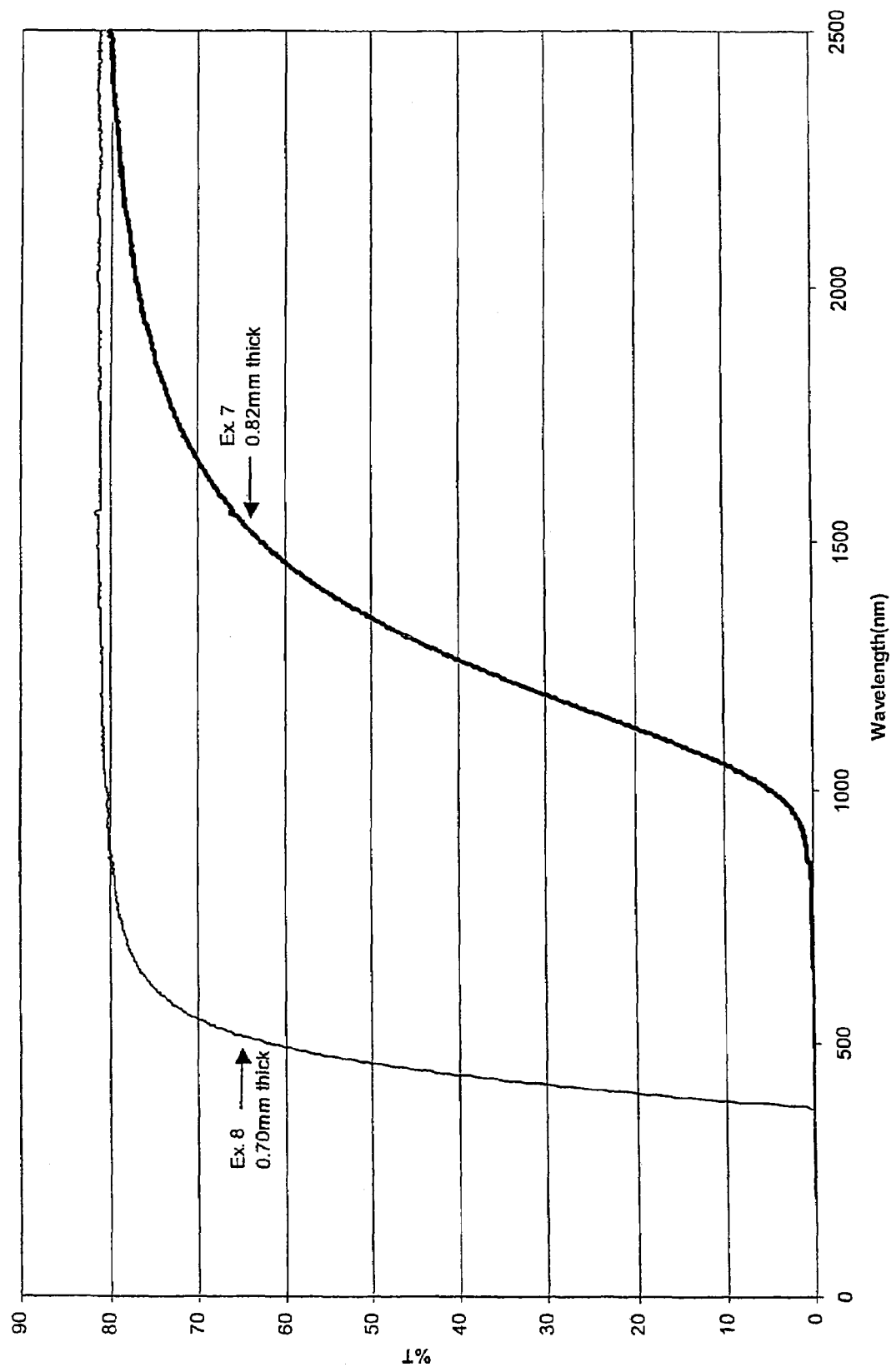
FIG. 1 the %-transmission of two samples according to the invention, shown over the wavelength.

The invention is more fully described by the following examples which are of merely exemplary nature not limiting the scope of the invention.

EXAMPLES

TABLE 1

| | Composition of examples and comparative examples | | | | | | | |
|---|---|---|---|---|---|---|---|---|
| Example | 1, 2 | | 3 | | 4, 5, 6, 9, 10 | | 7, 8 | |
| Composition | LB0-15 | | NGC-2 | | NGC-6 | | NGC-7 | |
| Component | mol-% | wt.-% | mol-% | wt.-% | mol-% | wt.-% | mol-% | wt.-% |
| $SiO_2$ | 60.0 | 71.1 | 42.0 | 21.0 | 45.5 | 22.6 | 35.0 | 16.5 |
| $B_2O_3$ | 6.7 | 9.2 | | | | | | |
| $Li_2O$ | 33.3 | 19.7 | | | | | | |
| $Na_2O$ | | | 29.0 | 14.9 | 13.6 | 7.0 | 32.5 | 15.8 |

TABLE 1-continued

Composition of examples and comparative examples

| Example | 1, 2 | | 3 | | 4, 5, 6, 9, 10 | | 7, 8 | |
|---|---|---|---|---|---|---|---|---|
| Composition | LB0-15 | | NGC-2 | | NGC-6 | | NGC-7 | |
| Component | mol-% | wt.-% | mol-% | wt.-% | mol-% | wt.-% | mol-% | wt.-% |
| $K_2O$ | | | | 13.6 | 10.6 | | | |
| $Nb_2O_5$ | | | 29.0 | 64.1 | 27.3 | 59.8 | 32.5 | 67.7 |
| Total | 100.0 | 100.0 | 100.0 | 100.0 | 100.0 | | | |

TABLE 2

Ceramization results for anisotropic samples
(translucent and piezoelectric)

| Example | 1 | 2 |
|---|---|---|
| Tnuc (° C.) | none | none |
| tnuc (hrs) | none | none |
| Tgr (° C.) | 825 | 825 |
| tgr (hrs) | 4 | 6 |
| q-heat (K/hr) | 300 | 300 |
| q-cool (K/hr) | 300 | 300 |
| Substrate Material | ½" Graphite (10" × 5") | 4" Insulating Ceramic Brick (10" × 5") |
| Surface Finish | Polished Faces | Polished Faces |
| $d_{33}$ (pC/N) | 5.7 | 5.0/−3.2 |
| $K_{33}$ | | |
| Processing Method | Brick | Recessed Brick |
| Visual Appearance | Translucent up to 30% Transmission | Translucent up to 30% Transmission |

TABLE 2-continued

Ceramization results for anisotropic samples
(translucent and piezoelectric)

| Example | 1 | 2 |
|---|---|---|
| XRD | | |
| $Li_2Si_2O_5$ | ~60 nm | 58 nm |
| crystal size (nm) | | |
| $Li_2SiO_3$ | ~30 nm | 32 nm |
| crystal size (nm) | | |
| Quartz | ~100 nm | 96 nm |
| crystal size (nm) | | |

TABLE 3

Ceramization results for poled samples
(IR-translucent and piezoelectric)

| Example | 3 | 4 | 5 | 6 | 7 |
|---|---|---|---|---|---|
| Tnuc (° C.) | none | none | none | none | none |
| tnuc (hrs) | none | none | none | none | none |
| Tgr (° C.) | 1075 | 1000 | 1000 | 1000 | 1050 |
| tgr (hrs) | 4 | 4 | 4 | 24 | 4 |
| q-heat (K/hr) | 150 | 300 to 550; 100 to 1000 | 300 to 550; 100 to 700; 100 to 1000 | 300 to 550; 100 to 1000 | 300 to 600; 100 to 1050 |
| q-cool (K/hr) | furnace off | 300 | 300 | 300 | 300 |
| $d_{33}$ (pC/N) | 5.6 | 2 | 2 | 1.9 | 3.3 |
| $K_{33}$ | 160 | 80.0 | 93.0 | 90.9 | 40.0 |
| tan δ | | 0.039 | 0.040 | 0.038 | 0.010 |
| $g_{33}$ (×$10^{-3}$ Vm/N) | 3.95 | 2.8 | 2.4 | 2.4 | 9.3 |
| Visual Appearance | IR-Translucent | IR-Translucent | IR-Translucent | IR-Translucent | IR-Translucent |
| Processing Method | Poled ferroelectric phase | Poled ferroelectric phase | Poled ferroelectric phase | Poled ferroelectric phase | Poled ferroelectric phase |
| XRD (wt.-%) | | | | | |
| Amorphous | 0 | 0 | 0 | 0 | 0 |
| $NaNbO_3$ | 80.9 | 46.2 | 46.1 | 46.7 | 87.2 |
| crystal size (nm) | 25 | 29 | 30 | 31 | 47 |
| $SiO_2$ (Cristobalite) | 9.8 | | | | 9.7 |
| crystal size (nm) | 19 | | | | 18 |
| $SiO_2$ (Tridymite) | 9.3 | | | | 3.1 |
| crystal size (nm) | 17 | | | | >100 |
| $K_3(NbO_2)_3(Si_2O_7)$ | | 21.6 | 21.3 | 21.9 | |
| crystal size (nm) | | 22 | 21 | 25 | |
| $KNbSi_2O_7$ | | 32.2 | 32.6 | 31.4 | |
| crystal size (nm) | | 22 | 22 | 22 | |

TABLE 4

Ceramization results for comparative examples
(translucent, but non-piezoelectric)

| Example | 8 | 9 | 10 |
|---|---|---|---|
| Tnuc (° C.) | none | none | 700 |
| tnuc (hrs) | none | none | 4 |
| Tgr (° C.) | 700 | 800 | 800 |
| tgr (hrs) | 4 | 4 | 4 |
| q-heat (K/hr) | 300 to 600; 100 to 700 | 300 to 550; 100 to 800 | 300 to 550; 100 to 700; 100 to 800 |
| q-cool (K/hr) | 300 | 300 | 300 |
| $d_{33}$ (pC/N) | 0 | 0 | 0 |
| $K_{33}$ | 74.2 | 80.3 | 75.0 |
| tan δ | 0.016 | 0.003 | 0.003 |
| Visual Appearance | translucent | translucent | translucent |
| Processing Method | Poled ferroelectric phase | Poled ferroelectric phase | Poled ferroelectric phase |
| XRD(wt.-%) | | | |
| Amorphous | | 84 | 90 |
| $NaNbO_3$ | 100 | 18 | 10 |
| crystal size (nm) | 22 | 14 | 13 |

In Table 1 the composition of the precursor glass that was used to prepare glass ceramics according to the invention (examples 1 to 7) is shown. Also comparative examples (examples 8 to 10) which were not piezoelectric are included.

In Table 2 the ceramization results for textured samples (examples 1 and 2) are summarized. The following abbreviations are used:

Tnuc (° C.): Nucleation temperature in Centigrade tnuc (hrs): Nucleation time in hours Tgr (° C.): Crystallization temperature in Centigrade tgr (hrs): Crystallization time in hours q-heat (K/hr): Heating rate in Kelvin per hour q-cool (K/hr): Cooling rate in Kelvin per hour $d_{33}$ (pC/N): Piezoelectric coefficient that describes the change in electrical polarization along the 3-direction due to an induced stress along the 3-direction given in pico Coulomb per Newton $K_{33}$: Electrical permittivity measured along the 3-direction $g_{33}$ (×10$^{-3}$ Vm/N): g-coefficient=$d_{33}/K_{33}$, given in Voltmeter per Newton.

The piezoelectric charge constant $d_{33}$ was measured using an APC wide-range $d_{33}$ meter, model YE2730A. This instrument is based on the Berlincourt method of measuring piezoelectric properties. A reference sample of PZT was used. Permittivity measurements ($K_{33}$) and loss measurements (tan δ) were made using an HP precision LCR meter, model 4284A, a Keithley Multimeter (temperature monitoring), and a Banstead/Thermolyne Furnace, model 47900. All X-ray diffraction measurements (XRD) were made with a Philips PW 1800 θ/θ diffractometer with nominal settings of Cu-radiation at 40 kv/30 mA over the angular range of 10° to 70° with a step size of 0.02° and an exposure time of 10 sec/step. Rietveld analysis was used to reduce the data in terms of weight fraction and nominal crystal size. In this application crystal size is defined as the smallest dimension of the crystal structure based on the broadening of X-ray diffraction peaks.

Ceramization of examples 1 and 2 was done in a furnace while placing the precursor glass sample on a graphite brick of a thickness of 12.7 mm (½ inch) of 25.4 cm×12.7 cm (10 inch×5 inch), or on a recessed insulating ceramic brick of a thickness of 101.6 mm (4 inch).

All sample sizes were 35 mm diameter, 2 mm thick.

Figure 2:
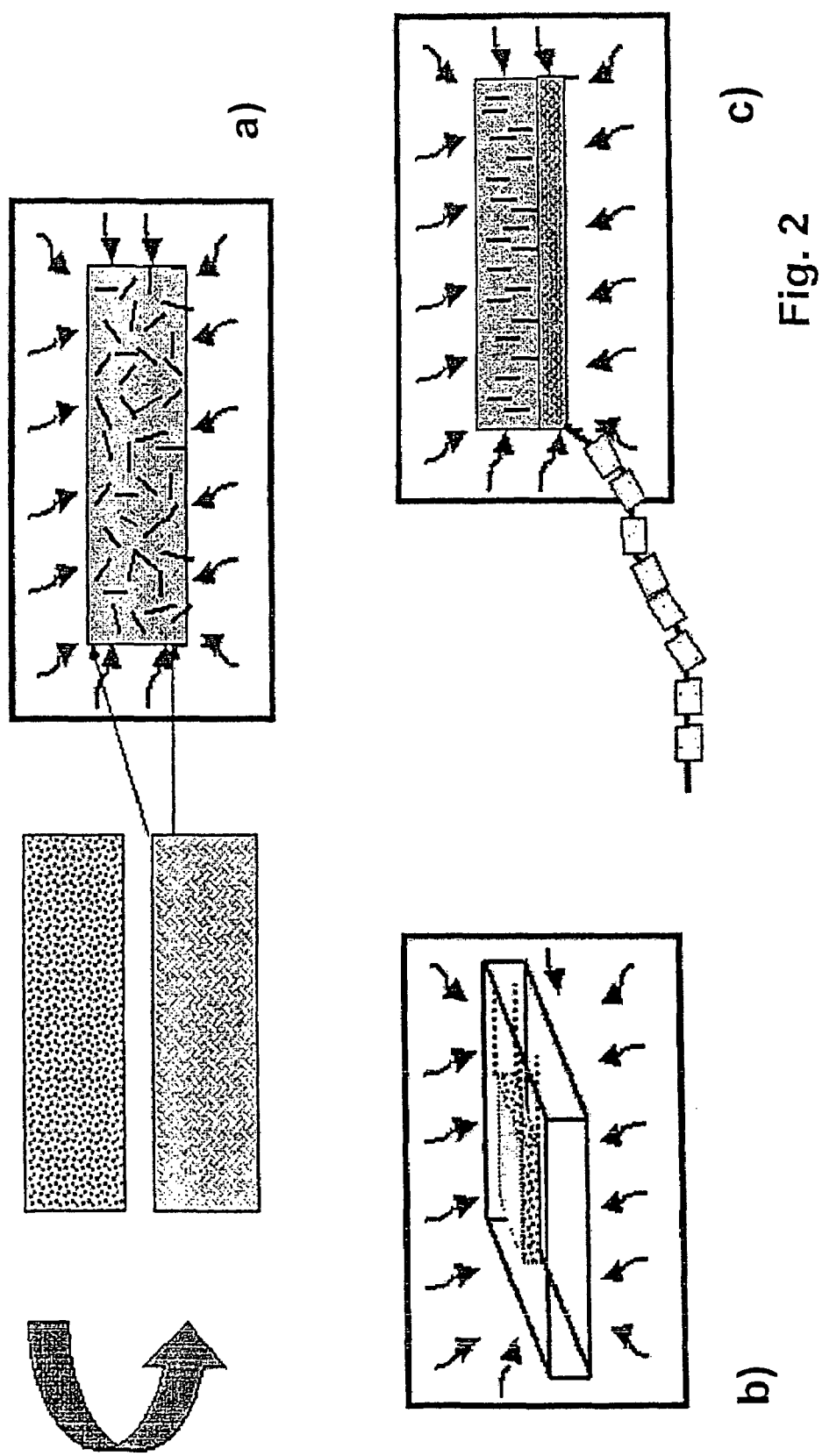
FIG. 2 a schematic representation of a new method according to invention to generate a preferred direction of orientation of precipitated crystallites using a recessed brick or a cold brick.

The "brick" methods will be briefly explained with reference to FIG. 2. In FIG. 2a) the conventional method of producing a glass ceramic from a precursor glass within a furnace is shown.

A controlled crystallization uses a specific heating cycle to effect nucleation and growth so that crystallites will grow randomly dispersed as shown schematically in FIG. 2a).

Even if the crystallites do not have a center of symmetry (COS) the resulting glass ceramic will not be piezoelectric due to the randomly dispersed crystallites.

To reach a piezoelectric behavior of the glass ceramic, it will be necessary to texture the glass ceramic during precipitation of the polar crystals. This is conventionally done by employing a temperature gradient across the precursor glass. In the state of the art a hot stage in a microscope was used (hot stage method).

According to the invention, instead the precursor glass sample is placed on a substrate ("brick") that has a larger (or smaller) thermal capacity than has the precursor glass sample. This procedure is schematically shown in FIG. 2b). Throughout this application this will be referred to as the "recessed brick" method.

According to a further variant of the invention, in addition, the substrate or brick may be cooled (or heated) to effect an even more pronounced arrangement of the crystallites in a preferred direction (which is perpendicular to the surface of the brick and within the direction of the temperature gradient). This is shown in FIG. 2c) and will be denoted throughout this application as the "cold brick" method.

The other samples 3 to 10 contained ferroelectric crystals which were poled subsequent to the crystallization of the precursor glass. This process provides the means by which to change the symmetry of a polycrystalline glass ceramic from that of a disordered material into one with conical (polar) symmetry. Poling relies on the unique feature of ferroelectric crystals of having two or more stable orientation states on a microscopic level and the ability to switch from one state to another through the use of an applied field. Poling typically takes place using fields of 1 to 4 MV/m for periods of several minutes at temperatures approaching the Curie temperature. Due to problems with electrical arching at the above-noted fields, normally the sample and electrodes are immersed in an insulating silicone oil with temperatures thus being limited <200° C. For PZT and related ferroelectric ceramics, this temperature limit is not too much of a problem, as this is near their Curie temperature. However, for the samples disclosed herein, with Curie temperatures exceeding 300° C., this posed a problem.

According to the invention, large samples of 35 mm diameter and a thickness of 2 mm were used with electrodes of 20 mm diameter. The resulting gap of about 7.5 mm between the edge of the electrode and the edge of the sample allowed to use much higher voltages than normally can be obtained without the use of silicone oil (>5 kV). Air-dried Ag paint was used for the electrodes, typically allowing >2 hours drying time before any measurements would take place, though more commonly over night. An appropriate temperature and electric field was used for poling.

Results

With examples 1 and 2 good piezoelectric charge constants, $d_{33}$, of 5.7 and 5.0/−3.2 were reached. Thus, both examples show a good piezoelectric behavior. Moreover, both samples are translucent up to about 30% transmission in the visible range VIS (380 nm to 780 nm). The translucency can be judged from visual inspection of the samples.

Using XRD $Li_2Si_2O_5$ crystallites of a crystal size of about 60 nm were found. In addition, $Li_2SiO_3$ crystallites of about 30 nm were found. Also quartz crystals of a crystal size of about 100 nm were detected. The heat treatment was selected to effect a crystal size smaller than 500 nm, in particular around 100 nm for the quartz crystals, around 60 nm for the $Li_2Si_2O_5$ crystals and around 30 nm for the $Li_2SiO_3$ crystals.

This crystal size is small enough to allow translucency in the visible range.

With respect to the ferroelectric (poled) samples that were poled to effect piezoelectricity the samples were ceramized within a furnace on alumina trays.

After ceramization poling was effected as described above.

Transmission measurements of examples 7 and 8 are shown in FIG. 1 over the wavelength. While example 8 is translucent in the VIS range, shows example 7 a translucency in the IR range.

While samples 3 to 7 showed piezoelectric behavior (e.g. $d_{33}$ constant 5.6 pC/N for sample 3), the comparative examples 8, 9 and 10 did not show any piezoelectric behavior) ($d_{33}$ not measurable).

This behavior is believed to be caused by too small crystal size of the ferroelectric crystallites so that piezoelectricity diminishes.

By contrast, examples 3 to 7 have larger crystal sizes which are still well below 100 nm.

Due to the large differences between the refraction indexes of the crystallites and the residual phase scattering can be caused. Therefore, a trade-off must be made between a crystal size which is small enough to allow translucency and which is large enough to generate piezoelectricity. It is believed that if a crystal size is chosen which is somewhat smaller than shown in examples 3 to 7 but still larger than the crystal size shown in examples 8 to 10, this will not only lead to IR-translucency but also to translucency in the VIS range.

What is claimed is:

1. A translucent piezoelectric glass ceramic prepared from a precursor glass by a ceraming process, the glass ceramic comprising non-ferroelectric piezo-active crystallites precipitated from the precursor glass with a preferred direction of orientation and having an average crystal size of less than 500 nanometers.

2. The glass ceramic of claim 1, wherein the precursor glass comprises 55 to 80 wt.-% of $SiO_2$, 1 to 40 wt.-% of $B_2O_3$ and 1 to 30 wt.-% of $Li_2O$.

3. The glass ceramic of claim 1, wherein the precursor glass comprises 70 to 73 wt.-% of $SiO_2$, 9 to 11 wt.-% of $B_2O_3$, and 18 to 22 wt.-% of $Li_2O$.

4. A translucent piezoelectric glass ceramic prepared from a precursor glass by a creaming process, the glass ceramic comprising non-ferroelectric piezo-active crystallites precipitated from the precursor glass with a preferred direction of orientation and having an average crystal size of less than 200 nanometers.

5. The glass ceramic of claim 1-4 having an average crystal size of less than 120 nanometers.

6. The glass ceramic of any of claim 1, comprising crystallites of the type selected from the group consisting of $Li_2Si_2O_5$, $Li_2SiO_3$, $Li_xB_yO_z$ and quartz.

7. The glass ceramic of any of claim 1, comprising crystallites consisting of $Li_2Si_2O_5$ having an average crystal size of less than 100 nanometers.

8. The glass ceramic of any of claim 1, comprising crystallites consisting of $Li_2SiO_3$ having an average crystal size of less than 100 nanometers.

9. The glass ceramic of claim 1, prepared from a precursor glass by a ceraming process within a furnace using a temperature gradient across the precursor glass induced by contacting the precursor glass with a brick material having a thermal capacity different from a thermal capacity of the precursor glass during annealing, the glass ceramic comprising non-ferroelectric piezo-active crystallites precipitated from the precursor glass with a preferred direction of orientation and having an average crystal size which is smaller than 500 nanometers.

10. A translucent piezoelectric glass ceramic prepared from a precursor glass by a ceraming process, the glass ceramic comprising ferroelectric crystallites precipitated from the precursor glass and poled by an electric field, the crystallites having an average crystal size of less than 90 nanometers.

11. The glass ceramic of claim 10, wherein the precursor glass comprises $SiO_2$, $Na_2O$ and $Nb_2O_5$.

12. The glass ceramic of claim 11, wherein the precursor glass comprises 10 to 35 wt.-% of $SiO_2$, 0 to 20 wt.-% of $Na_2O$, 0 to 30 wt.-% of $K_2O$, and 50 to 80 wt.-% of $Nb_2O_5$.

13. The glass ceramic of claim 12, wherein the precursor glass comprises 15 to 25 wt.-% of SiO2, 5 to 20 wt.-% of $Na_2O$, 0 to 15 wt.-% of $K_2O$, and 55 to 75 wt.-% of $Nb_2O_5$.

14. The glass ceramic of claim 10, comprising $NaNbO_3$ crystallites having an average crystal size between 15 and 50 nanometers.

15. The glass ceramic of claim 10, comprising potassium-silica-niobate crystallites having an average crystal size of at least 10 nanometers.

16. The glass ceramic of claim 15, comprising potassium-silica-niobate crystallites having an average crystal size between 10 and 30 nanometers.

17. The glass ceramic of claim 10, having a translucency of at least 20% in a range selected from the group consisting of the visible light range and the infrared range.

* * * * *

UNITED STATES PATENT AND TRADEMARK OFFICE
CERTIFICATE OF CORRECTION

PATENT NO. : 7,591,961 B2
APPLICATION NO. : 11/699442
DATED : September 22, 2009
INVENTOR(S) : Katherine Ann Gudgel et al.

Page 1 of 1

It is certified that error appears in the above-identified patent and that said Letters Patent is hereby corrected as shown below:

Column 10,

Line 4, "claim 1-4" should be -- claim 4 --.
Line 6, delete "any of".
Line 9, delete "any of".
Line 12, delete "any of".
Line 37, "SiO2" should be -- $SiO_2$ --.

Signed and Sealed this

Seventeenth Day of November, 2009

David J. Kappos
*Director of the United States Patent and Trademark Office*